United States Patent [19]
Dobson et al.

[11] Patent Number: 5,965,212
[45] Date of Patent: Oct. 12, 1999

[54] METHOD OF PRODUCING METAL QUANTUM DOTS

[75] Inventors: Peter James Dobson; Oleg Viktorovich Salata; Peter James Hull; John Laird Hutchison, all of Oxford, United Kingdom

[73] Assignee: Isis Innovation Limited, Oxford, United Kingdom

[21] Appl. No.: 09/000,272

[22] PCT Filed: Jul. 29, 1996

[86] PCT No.: PCT/GB96/01853

§ 371 Date: Jan. 27, 1998

§ 102(e) Date: Jan. 27, 1998

[87] PCT Pub. No.: WO97/04906

PCT Pub. Date: Feb. 13, 1997

[30] Foreign Application Priority Data

Jul. 27, 1995 [GB] United Kingdom .................... 9515439

[51] Int. Cl.$^6$ ........................................... B05D 1/06
[52] U.S. Cl. ........................... 427/469; 222/190; 222/630; 427/191; 427/256; 427/294; 427/383.1; 427/427; 427/466; 427/475; 427/480; 427/485; 427/555; 427/595
[58] Field of Search ..................... 427/475, 480, 427/485, 555, 596, 191, 256, 294, 383.1, 427, 466, 469; 222/190, 630

[56] References Cited

FOREIGN PATENT DOCUMENTS 0266 999  5/1988  European Pat. Off. .
0 328 202  8/1989  European Pat. Off. .

OTHER PUBLICATIONS

Materials Science and Engineering B, vol. B23, No. 2, Apr. 10, 1994, pp. 116–119, XP000483602 Zhu Y et al: "Radiation–Hydrothermal Synthesis and Characterization of Nanocrystalline Copper Powders" see p. 119, right–hand column, line 5 – line 15.

Nanostructured Materials, vol. 4, No. 8, Dec. 1, 1994, pp. 915–918, XP000478059 Zyu Y et al: "Preparation of Nanocrystalline Tin Powders by the gamma–Radiation Method" see p. 918, line 1–line 6.

Primary Examiner—Bernard Pianalto
Attorney, Agent, or Firm—Nixon & Vanderhye P.C.

[57] ABSTRACT

Metal quantum dots are produced from a solution of the metal salt when the solution is passed through an electrostatic capillary nozzle (3) into a chamber (7). The nozzle (3) produces an aerosol of droplets (4) of the solution which is then irradiated using laser light (8). The solution evaporates from the droplets to form quantum dots of the metal element on a substrate 5 in the chamber 7.

13 Claims, 1 Drawing Sheet

METHOD OF PRODUCING METAL QUANTUM DOTS

BACKGROUND OF THE INVENTION

1. Field of the Invention

The present invention relates to a method of producing metal quantum dots. In particular the method enables metal quantum dots of uniform size to be produced which can be used in providing very regular metal layers.

2. Discussion of Prior Art

Quantum dots are defined as small particles whose linear dimension in all three directions is less than the de Broglie wavelength of the electrons or holes. Such particles can have a greatly modified electronic structure from the corresponding bulk material. To date methods of producing quantum dots have focussed on semiconductor material for use in the field of optoelectronics. A paper describing semiconductor quantum dots and some of their properties has been published in Angewandte Chemie International Edition (English) 1993, 32, at pages 41–53: "semiconductor q-particles: chemistry in the transition region between solid state and molecules" by Horst Weller. A number of methods of producing semiconductor quantum dots have also been tried and these have been centred on the generation of colloids or inverse micelles or on "smokes". Variability in size has though remained a problem. More recently a method of producing semiconductor quantum dots using an electrostatic nozzle assembly has been developed in which each of the individual droplets formed in an aerosol functions as a separate reaction chamber in the presence of a gas phase reagent.

With the present invention there has been the surprising discovery that single element metal quantum dots may be produced using an electrostatic nozzle and irradiation of the aerosol formed in the absence of a gas phase reagent.

Thus, the present invention provides a method of producing metal quantum dots, which method comprises providing a solution in an evaporable solvent of the metal in chemically combined form, passing the solution through an electrostatic capillary nozzle to form droplets of the solution in a chamber, irradiation of the droplets within the chamber with photons and removing the evaporable solvent from the droplets to form metal particles.

The method starts with a solution in an evaporable solvent of the chosen metal in chemically combined form. The evaporable solvent is volatile in the sense that the solvent is evaporable under the reaction conditions used and may be water or an organic solvent whose nature is not important. Although other chemically combined forms are possible, the metal is typically present in the form of a salt, preferably a salt with a volatile anion such as nitrate or chloride. A wide variety of metals may be used indeed almost any metal which produces positive ions in solution such as Ag, Ni, Fe or Co.

The solution may contain polyphosphate as stabiliser, for example in the form of sodium polyphosphate which has an average chain length of about 15 $PO^-_3$ units. Polyphosphate is well suited for the stabilisation of nanometer size particles, because the chain is strongly bound by metal ions on to the particle surface. It causes electrostatic repulsion between particles because of its charge, and also keeps them apart sterically because of its chain length. Other frequently used stabilisers are thiols. Alternatively, the starting solution may contain an organic polymer which encapsulates the metal particle. Many organic polymers, in solution or dispersion in the volatile liquid, are suitable and known to those working in the field. Examples of suitable polymers include polyvinyl alcohol, polyvinyl acetate, polymethyl methacrylate and polycarbonate. With each of the above examples of stabilisers, particle aggregation whilst in solution is prevented. Subsequently though the polyphosphate or organic polymer binds the dried particles into a film.

The solution is converted into droplets, and ideally the size of these droplets is made as nearly uniform as possible. For this purpose an electrostatic capillary nozzle is used in which a jet of aerosol droplets can be formed by the electrostatic deformation of a meniscus of the starting solution. The droplet size can be controlled by varying the flow rate from a reservoir and the voltage applied to the nozzle.

The droplets emerge from the nozzle into a chamber preferably under low-pressure conditions and are irradiated preferably using a laser. The volatile solvent is evaporated off to leave the desired particles of metal. Where the starting solution contained a polymer, the particles are encapsulated in the polymer.

The size of the resulting particles or quantum dots depends on two factors: the concentration of the chemically combined metal in the starting solution; and the size of the formed droplets. Both these variables are readily controlled and pre-determined either experimentally or theoretically to provide quantum dots of desired size, which is typically less than 25 nm, and preferably in the range 1 to 20 nm.

BRIEF DESCRIPTION OF THE DRAWINGS

Preferred embodiments of the present invention are disclosed in the several views, in which.

DETAILED DESCRIPTION OF PREFERRED EMBODIMENTS

Figure 1:
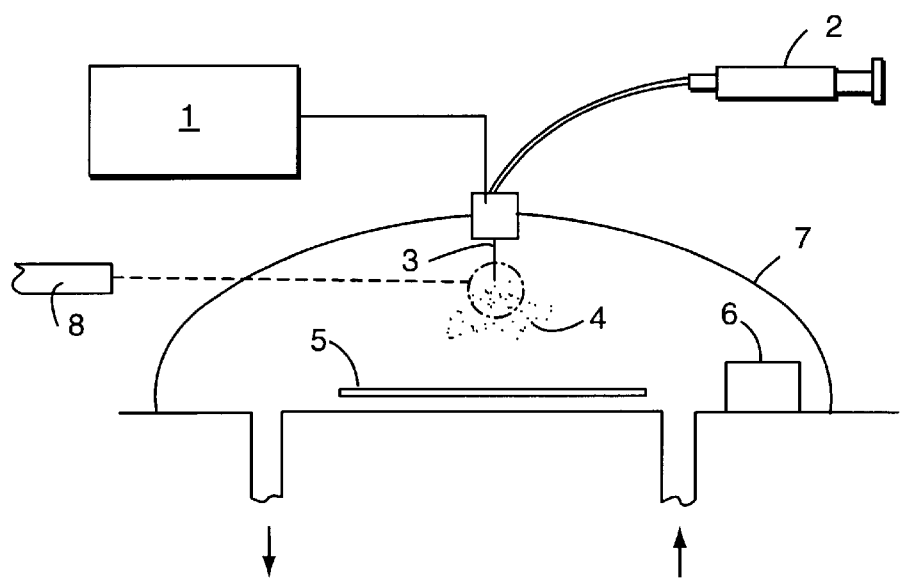
FIG. 1 is a side cross-sectional view of an apparatus implementing the present invention.
Figure 1A:
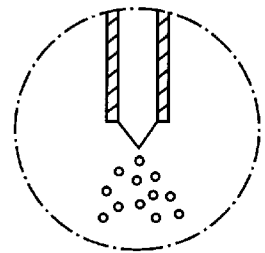
FIG. 1a is an enlargement of the circled portion of FIG. 1.

An example of a spray nozzle assembly which may be used to generate the desired droplet size is shown in FIG. 1. The assembly consists of a reaction chamber 7 which is an evacuable chamber having inlet and outlet ports for the introduction and circulation, if desired, of a gas, e.g. nitrogen or argon. A capillary nozzle member 3, which may be a conventional capillary tube, projects into an upper region of the reaction chamber 7 and is connected to a reservoir 2 of the solution to be issued as an aerosol. The capillary nozzle member 2 which is preferably a metal capillary of stainless steel or platinum for example, is also connected to a voltage supply 1 for raising the voltage potential of the nozzle member so that it is positive with respect to a substrate 5 located along the base of the reaction chamber 7. A laser 8 is positioned outside of the chamber 7 so as to irradiate the aerosol 4 formed at the nozzle 2 or in the region of Rayleigh Taylor cone. The chamber 7 may be substantially transparent to the laser light or may have a window (not shown) which is transparent.

When in use, the positive potential is applied to the nozzle member 3 and the solution delivered from the reservoir 2 to the nozzle member 3 at a minimum permissible pressure. The aerosol droplets 4 formed fall from the nozzle member 3 under the effect of gravity and the applied voltage potential to the substrate 5 beneath. As the aerosol droplets 4 fall they are illuminated by the laser 8 having an energy density preferably greater than $10^3$ $Wm^{-2}$ at a wavelength less than 700 nm. The solvent is evaporated leaving quantum dots of the element metal on the substrate 5.

The assembly may be used to coat a static substrate or alternatively could be used in a continuous process for the coating of a moving liner substrate such as a tape. In these circumstances the rate of movement of the tape must be matched to the arrival rate of the particles. The assembly can also be used to "write" a structure with the particles, such as a wave guide. Since the droplets are highly charged, they can be focussed and deflected in any conventional manner to control the deposition site of the particles on the substrate.

In an appropriately configured assembly a single layer of quantum dots may be deposited on the substrate. Also, the layer(s) of quantum dots may coalesce on the substrate to form a continuous thin film.

Where the aerosol droplet production is done under reduced pressure, the resulting particles will have some forward momentum, and are deposited on the substrate placed under the nozzle. The particles also can be dispersed into a liquid carrier, e.g. a solution of the aforementioned polymers, which may then be coated onto a substrate, e.g. by spin coating and dried.

The following examples illustrates the invention.

EXAMPLE 1

A starting solution was prepared consisting of $10^{-3}$M silver nitrate which is diluted with methanol. The solution was supplied to the electrostatic spray nozzle assembly shown in FIG. 1, operated at 1–10 keV, so as to generate aerosol droplets of diameter 0.1 to 10 $\mu$m. The Rayleigh Taylor cone and the aerosol were illuminated using a He-Ne laser (633 nm) having 1 mW output power with a beam having a cross-section at the nozzle of around 1 mm$^2$.

The methanol evaporated off to give particles of Ag which coalesced to form a quasi-continuous layer.

EXAMPLE 2

A starting solution was prepared consisting of $10^{-3}$M silver nitrate, the solution also containing 1M sodium hexametaphosphate and was diluted with methanol. The solution was supplied to the electrostatic spray nozzle assembly operated as 1–10 keV so as to generate aerosol droplets of diameter 0.1 to 10 $\mu$m. The aerosol was illuminated as described in Example 1. The methanol evaporated off to give particles of Ag with the hexametaphosphate forming an inorganic polymer which encapsulated the particles and formed a polyphosphate film containing the particles.

Alternative stabilisers or polymers such as polyvinyl alcohol have been used, with similar results.

EXAMPLE 3

A starting solution was prepared consisting of $10^{-1}$M nickel chloride in water which was then diluted with methanol to provide a $10^{-3}$M solution. As described above the solution was supplied to the nozzle assembly which was held at a potential of 1–10 keV, preferably 4 keV, thereby generating aerosol droplets of the desired diameter and irradiated.

The methanol evaporated off to give particles of nickel. The same method has also been employed with nickel nitrate.

EXAMPLE 4

A starting solution was prepared consisting of $10^{-1}$M iron nitrate in water which was then diluted with methanol to provide a $10^{-3}$M solution. The solution was supplied to the electrostatic capillary nozzle which was held at a positive potential >3 keV. The resultant aerosol was irradiated as described earlier using a He-Ne laser.

The methanol evaporated off to give particles of iron which oxidised after exposure to air to form iron oxide particles. The same method has also been employed using cobalt nitrate to produce cobalt oxide quantum dots.

Metal particles of the size described above have applications in many industries. For example, ferromagnetic material becomes superparamagnetic when made into fine particles. Such a material retains a high magnetic permeability but shows no hysteresis, remanence or coercivity and can be usefully employed in miniature inductors, and electric motors etc. as magnetic losses can be eliminated. Also fine metal particles can be used in dyes for plastics, glasses or ceramics for example. Moreover, very non-linear optical properties can be obtained with sub 10 nm metal particles for example. Other and further applications of metal particles manufactured by the method described herein are envisaged.

We claim:

1. A method of producing metal quantum dots, which method comprises:

(1) providing a solution in an evaporable solvent of the metal in chemically combined form, (2) passing the solution through an electrostatic capillary nozzle to form droplets of the solution in a chamber, (3) irradiation of the droplets within the chamber with photons and (4) removing the evaporable solvent from the droplets to form metal or metal oxide particles.

2. A method as claimed in claim 1, wherein the solution is a metal salt of a cationic metal.

3. A method as claimed in claim 2, wherein the cationic metal is selected from Ag, Ni, Fe or Co.

4. A method as claimed in claim 1, wherein a polymer is provided in the solution.

5. A method as claimed in claim 1, wherein the electrostatic capillary nozzle is held at a positive potential of between 1 and 10 keV with respect to the chamber.

6. A method as claimed in claim 1, wherein the solution is supplied to the electrostatic capillary nozzle at a minimum possible pressure.

7. A method as claimed in claim 1, wherein the chamber contains an inert gas.

8. A method as claimed in claim 7, wherein the inert gas is selected from nitrogen or argon.

9. A method as claimed in claim 1, wherein the metal quantum dots formed are deposited on a substrate.

10. A method as claimed in claim 9, wherein the substrate is located within the chamber.

11. A method as claimed in claim 10, wherein an electric field is applied across the chamber to control the deposition of the metal quantum dots on the substrate.

12. A method as claimed in claim 1 wherein the droplets are irradiated using laser light having an energy density equal to or greater than $1 \times 10^3 \text{Wm}^{-2}$.

13. A method as claimed in claim 12 wherein the droplets are irradiated using a He-Ne laser.

* * * * *